(12) United States Patent
Kao et al.

(10) Patent No.: US 8,417,472 B2
(45) Date of Patent: Apr. 9, 2013

(54) SYNCHRONIZED DATA SAMPLING SYSTEMS AND METHODS

(75) Inventors: Han-Jung Kao, Taipei (TW); Xiaohua Hou, Beijing (CN); Xiaofeng Wang, Beijing (CN)

(73) Assignee: O2Micro Inc., Sunnyvale, CA (US)

( * ) Notice: Subject to any disclaimer, the term of this patent is extended or adjusted under 35 U.S.C. 154(b) by 568 days.

(21) Appl. No.: 12/637,474

(22) Filed: Dec. 14, 2009

(65) Prior Publication Data

US 2010/0161260 A1   Jun. 24, 2010

Related U.S. Application Data

(60) Provisional application No. 61/203,227, filed on Dec. 19, 2008.

(51) Int. Cl.
*G01R 31/36* (2006.01)
*H02J 7/00* (2006.01)
*G08B 21/00* (2006.01)
*G05B 21/02* (2006.01)

(52) U.S. Cl.
USPC ............. 702/63; 320/112; 340/636.1; 700/73

(58) Field of Classification Search .................... 702/63, 702/57, 60–62, 64–65, 81, 84, 127, 130–131, 702/133, 136, 176, 182–184, 188–189, 199; 320/112, 116, 118–120, 127, 134–136; 324/427, 324/432; 340/500, 636.1, 636.12–636.13, 340/636.15–636.16, 636.18–636.19, 657, 340/660, 662–664; 700/3, 9, 11–12, 22, 700/26, 73, 108–110, 286, 297–298
See application file for complete search history.

(56) References Cited

U.S. PATENT DOCUMENTS

| 6,031,354 | A | 2/2000 | Wiley et al. |
| 7,782,014 | B2 | 8/2010 | Sivertsen |
| 2004/0051534 | A1 | 3/2004 | Kobayashi et al. |
| 2004/0164706 | A1* | 8/2004 | Osborne .................. 320/116 |

(Continued)

FOREIGN PATENT DOCUMENTS

| CN | 101119036 A | 2/2008 |
| JP | 2000270492 A | 9/2000 |
| JP | 2008281465 A | 11/2008 |
| JP | 2009168720 A | 7/2009 |

OTHER PUBLICATIONS

Stuart et al., A Modular Battery Management System for HEVs, Oct. 10, 2006 (by Internet Archive Wayback Machine), www.nrel.gov/vehiclesandfuels/energystorage/pdfs/3a_2002_01_1918.pdf, 9 pp.*

Internet Archive Wayback Machine, www.nrel.gov/vehiclesandfuels/energystorage/pdfs/3a_2002_01_1918.pdf, Sep. 24, 2012, 1 pp.*

*Primary Examiner* — Toan Le

(57) ABSTRACT

A battery management system with synchronized data sampling for a battery pack including multiple battery cells is disclosed. The battery management system includes a plurality of local monitors coupled to a plurality of battery cells and operable for sampling status information for the battery cells. The battery management system further includes a central controller coupled to the local monitors and operable for broadcasting a sample command to the local monitor synchronously, wherein the local monitors start to sample the status information for the battery cells in response to the sample command.

20 Claims, 7 Drawing Sheets

U.S. PATENT DOCUMENTS

2008/0100266 A1 5/2008 Sobue
2008/0282018 A1 11/2008 Nakanishi
2009/0128095 A1 5/2009 Masson et al.
2009/0265121 A1 10/2009 Rocci et al.

* cited by examiner

SYNCHRONIZED DATA SAMPLING SYSTEMS AND METHODS

RELATED APPLICATION

This application claims priority to U.S. Provisional Application No. 61/203,227, "Synchronized Data Sampling System," filed on Dec. 19, 2008, which is hereby incorporated by reference in its entirety.

BACKGROUND

A battery management system can be used to monitor a battery pack that includes one or more battery cells, and to collect and analyze monitoring data indicative of the status of the battery pack in order to keep the battery pack working in a normal condition. The monitoring data typically includes voltages and currents of the battery cells. Generally, the battery pack voltage can be obtained by adding the voltages of the battery cells, which are sampled at the same time. However, it can be difficult and/or costly to use a global clock to sample the voltages and the currents of the battery cells synchronously since the battery cells are isolated from each other. Without a global clock, monitoring data may be sampled cycle-by-cycle independently by configuring a local clock to each battery cell. However, even if all the local clocks are designed to be the same as each other, small errors induced by variations in the environment can accumulate, affecting the monitoring data and hence the performance of the battery management system.

FIG. 1 illustrates an asynchronous data sampling diagram 100 for a conventional battery management system. In the example of FIG. 1, a data sampling diagram 102 for a first battery BATT1 and a data sampling diagram 104 for a second battery BATT2 are shown. The BATT1 and the BATT2 can be any two of the battery cells in the battery pack. The battery management system can sample the monitoring data indicative of the status of a corresponding battery cell periodically. The sample periods for the BATT1 and the BATT2 are designed to be the same value $T_N$. However, sample periods for the BATT1 are asynchronous with sample periods for the BATT2 since the battery management system samples each battery cell according to its own sampling timing.

If the battery management system intends to get sample data for the battery pack at time TS, the battery management system will get the latest sample data $D_1(N)$ for the BATT1 obtained at the end of sample period $T_1(N)$, and will also get the latest sample data $D_2(N-1)$ for the BATT2 obtained at the end of sample period $T_2(N-1)$. As such, a time difference between the end of the sample period $T_1(N)$ and the end of the sample period $T_2(N-1)$ may be almost one sample period $T_N$. Since the sample period $T_N$ can be several milliseconds or even longer, the time difference between the end of the sample period $T_1(N)$ and the end of the sample period $T_2(N-1)$ may be several milliseconds.

In some applications, such as electric vehicle/hybrid electric vehicle applications, a load current can fluctuate frequently. As such, the load current at the end of the sample period $T_1(N)$ and the load current at the end of the sample period $T_2(N-1)$ may not be the same value since the time difference between the end of the sample period $T_1(N)$ and the end of the sample period $T_2(N-1)$ may be several milliseconds. Hence, the sample data $D_1(N)$ for the BATT1 obtained at the end of sample period $T_1(N)$ and the sample data $D_2(N)$ for the BATT2 obtained at the end of sample period $T_2(N-1)$ may be sampled in different environments, which may decrease the accuracy of the battery management system.

SUMMARY

In one embodiment, a battery management system with synchronized data sampling for a battery pack including multiple battery cells is disclosed. The battery management system includes a plurality of local monitors coupled to a plurality of battery cells and operable for sampling status information for the battery cells. The battery management system further includes a central controller coupled to the local monitors and operable for broadcasting a sample command to the local monitor synchronously, wherein the local monitors start to sample the status information for the battery cells in response to the sample command.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Battery management systems with synchronized data sampling for a battery pack including multiple battery cells are disclosed. In one embodiment, the battery management system includes multiple local monitors to sample the status information for the battery cells, such as the battery cell voltages and/or the battery cell temperatures. In one embodiment, the battery management system further includes a central controller to estimate the state of the battery pack/cells, such as the state of health (SOH) and/or the state of charge (SOC), and manage the battery pack/cells according to the state of the battery pack/cells. The SOH is a "measurement" that reflects the general condition of the battery pack/cells, e.g., charge acceptance, internal resistance, voltage and self-discharge of the battery pack/cells. The SOC is determined by measuring the actual charge in the battery pack. In one embodiment, if the estimated state information for the SOC of the battery pack indicates the actual charge in the battery pack is lower than a predetermined threshold, the central controller can alert the user that the battery pack is low on power or out of power.

In some embodiments, multiple upper controllers can be employed between the central controller and the local monitors to enhance flexibility. When the central controller broadcasts a sample command to the local monitors, the local monitors can start a sample period synchronously and sample the status information for the battery cells during the same sample period. At the end of the sample period, the local monitors can report sample data to the central controller.

Figure 1:
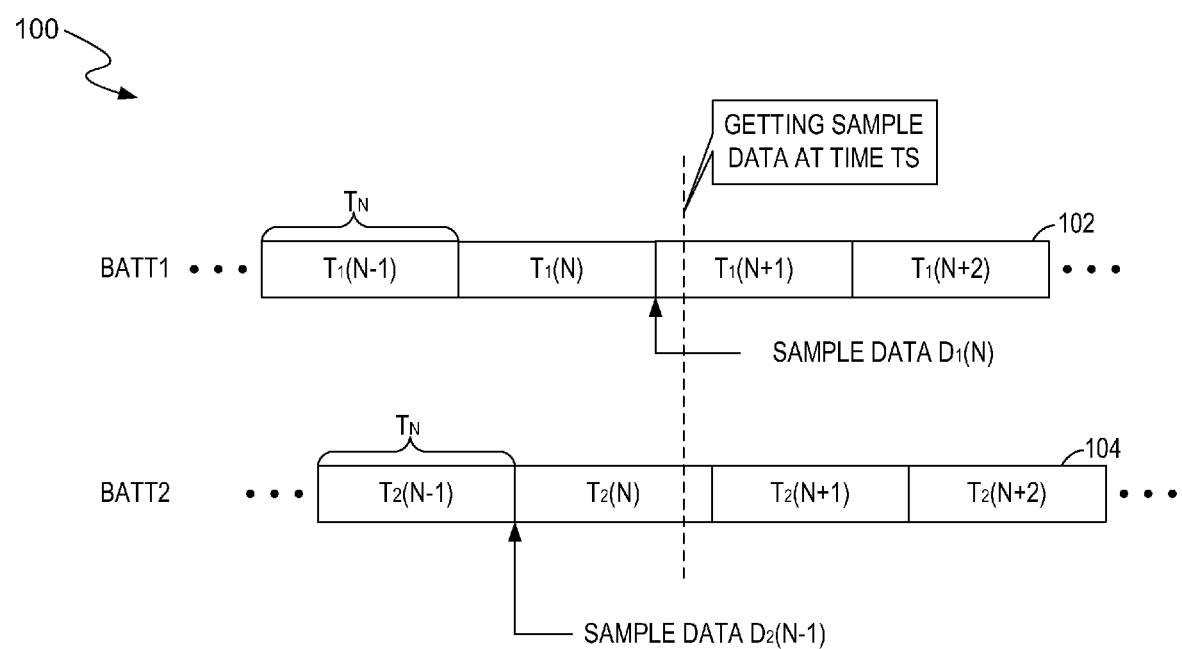
FIG. 1 illustrates an asynchronous data sampling diagram for a conventional battery management system.
Figure 2A:
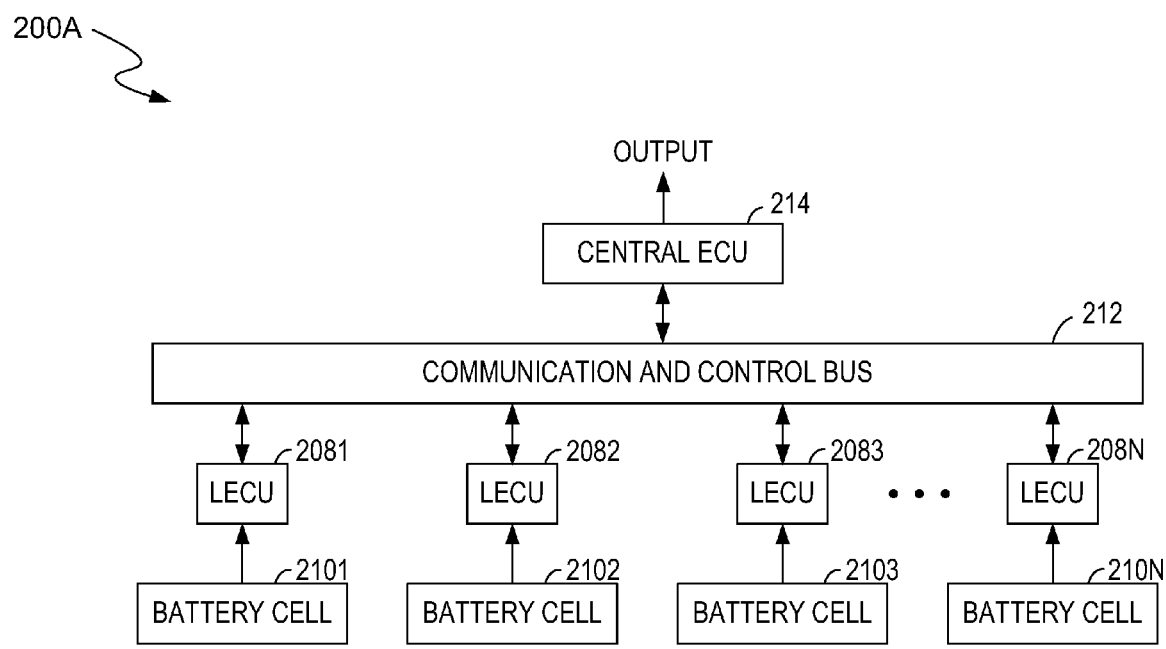
FIG. 2A illustrates a block diagram of a battery management system with synchronized data sampling, in accordance with one embodiment of the present invention.

FIG. 2A is a block diagram of a battery management system 200A with synchronized data sampling, in accordance with one embodiment of the present invention. In one embodiment, the battery management system 200A can have a centrally-distributed and hierarchical architecture. However, the battery management system 200A can have other configurations and is not limited to a centrally-distributed and hierarchical architecture.

In one embodiment, the battery management system 200A includes multiple local monitors, e.g., local electric control units (LECUs) 2081-208N, to sample the status information for the battery cells 2101-210N, such as the battery cell voltages and/or the battery cell temperatures. The LECUs 2081-208N can sample the status information for the battery cells during a same sample period and report the sample data to a central controller, e.g., a central electric control unit (central ECU) 214, via a communication and control bus 212, in one embodiment.

According to the sample data received from the LECUs 2081-208N, the central ECU 214 can estimate the state of the battery pack and for each cell in the battery pack, such as the state of health and/or the state of charge of the battery pack or of a cell.

During operation of the battery management system 200A, to collect status information for the battery cells, the central ECU 214 can broadcast a sample command to the LECUs 2081-208N via the communication and control bus 212. In response to the sample command, the LECUs 2081-208N can start to sample the status information for the battery cells 2101-210N synchronously.

During the same sample period, the target LECUs can sample the status information for the battery cells 2101-210N. At the end of the sample period, the target LECUs can report the sample data to the central ECU 214 via the communication and control bus 212. The LECUs can start another sample period if they receive a new sample command from the central ECU 214.

In another embodiment, after the battery management system 200A starts up, the LECUs 2081-208N start to sample the status information for the battery cells 2101-210N during continuous sample periods controlled by local clocks of the LECUs 2081-208N. The central ECU 214 broadcasts a sample command to the LECUs 2081-208N via the communication and control bus 212. In response to the sample command, the LECUs 2081-208N synchronize their sample periods with each other. In one embodiment, the LECUs 2081-208N can synchronously stop their current sample periods and start a new sample period in response to the sample command. At the end of the new sample period, the LECUs 2081-208N can report the sample data to the central ECU 214 via the communication and control bus 212. Then each of the LECUs 2081-208N can continue to sample the status information for corresponding one of the battery cells 2101-210N during the sample periods contiguous with (immediately following) the preceding period and controlled by the corresponding local clocks.

To summarize, in one embodiment, the LECUs sample status information of the battery cells during a single sample period in response to a sample command from the central ECU—the sample period for each LECU starts and ends at the same time, and the LECUs do not collect additional status information until another sample command is received. In another embodiment, the LECUs start to sample status information of the battery cells during continuous sample periods controlled by their own local clocks when the system starts up. The LECUs can stop their current sample periods and start a new sample period synchronously in response to a sample command from the central ECU—the new sample period for each LECU starts and ends at the same time, and the LECUs continue to collect status information during consecutive sample periods following the new sample period.

Advantageously, the status information for the battery cells can be sampled in the same environment (under the same conditions) even if the load current fluctuates frequently, such as in electric vehicle/hybrid electric vehicle applications. As such, the central ECU 214 can estimate the state of the battery pack more accurately based on the status information for the battery cells sampled by the LECUs 2081-208N.

Figure 2B:
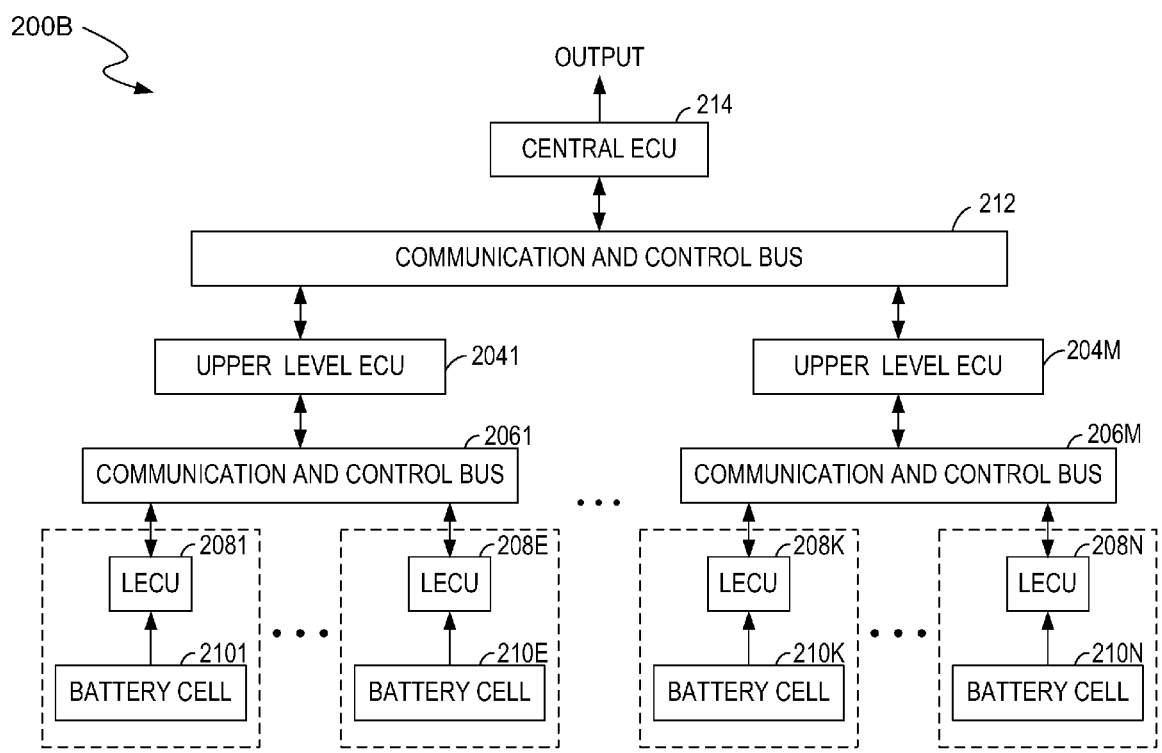
FIG. 2B illustrates a block diagram of a battery management system with synchronized data sampling, in accordance with another embodiment of the present invention.

FIG. 2B is a block diagram of a battery management system 200B with synchronized data sampling, in accordance with another embodiment of the present invention. Elements that are labeled the same as in FIG. 2A have similar functions. Similarly, the battery management system 200B can have a centrally-distributed and hierarchical architecture in one embodiment. However, the battery management system 200B can have other configurations and is not limited to a centrally-distributed and hierarchical architecture.

In the battery management system 200B, multiple upper controllers, e.g., upper electric control units (upper ECUs) 2041-204M, can be coupled between the central ECU 214 and the LECUs 2081-208N. The number of upper ECUs 2041-204M can be less than or equal to the number of the LECUs 2081-208N. Each upper ECU can communicate with a predetermined number (one or more) of the LECUs via a corresponding communication and control bus, e.g., the upper ECU 2041 can communicate with the LECUs 2081-208E (0<E≦N) via a communication and control bus 2061. The upper ECUs 2041-204M can also communicate with the central ECU 214 via the communication and control bus 212.

In one embodiment, the upper ECUs 2041-204M can estimate the SOH and SOC of the corresponding battery cells by analyzing the sample data received from the corresponding LECUs via the corresponding communication and control buses. For example, the upper ECU 2041 can estimate the SOH and SOC of the battery cells 2101-210E by analyzing the sample data received from the LECUs 2081-208E via the communication and control bus 2061. The upper ECUs 2041-204M can further provide analyzed data, e.g., information about the SOH and SOC of the corresponding battery cells, to the central ECU 214 via the communication and control bus 212. The upper ECUs 2041-204M can also transfer the sample data along with the analyzed data to the central ECU 214.

According to the data received from the upper ECUs, the central ECU 214 can estimate the state of the battery pack, such as the state of health and/or the state of charge of the battery pack.

During operation of the battery management system 200B, to collect status information for the battery cells, the central ECU 214 can broadcast a sample command to the upper ECUs 2041-204M via the communication and control bus 212. Accordingly, the upper level ECUs 2041-204M can synchronously broadcast the sample command to the target LECUs via the corresponding communication and control buses. As such, the target LECUs can start a sample period synchronously or synchronize their sample periods with each other. At the end of the sample period, the target LECUs can report the sample data to the central ECU via the corresponding upper level ECUs.

Furthermore, by configuring the upper ECUs between the central ECUs 214 and the LECUs 2081-208N in FIG. 2B, the central ECU 214 can broadcast a sample command to a subset of the LECUs 2081-208N via the corresponding upper ECU(s) to collect status information for the corresponding subset of the battery cells 2101-210N. For example, the central ECU 214 can broadcast a sample command to the LECUs 2081-208E via the upper ECU 2041 to collect the status information for the battery cells 2101-210E. Additionally, each of the upper ECUs can estimate the states of a corresponding subset of the battery cells by analyzing the sample data received from the corresponding LECUs, and can send the estimating information to the central ECU 214, thereby assisting the central ECU and enhancing the efficiency of the central ECU.

Figure 3:
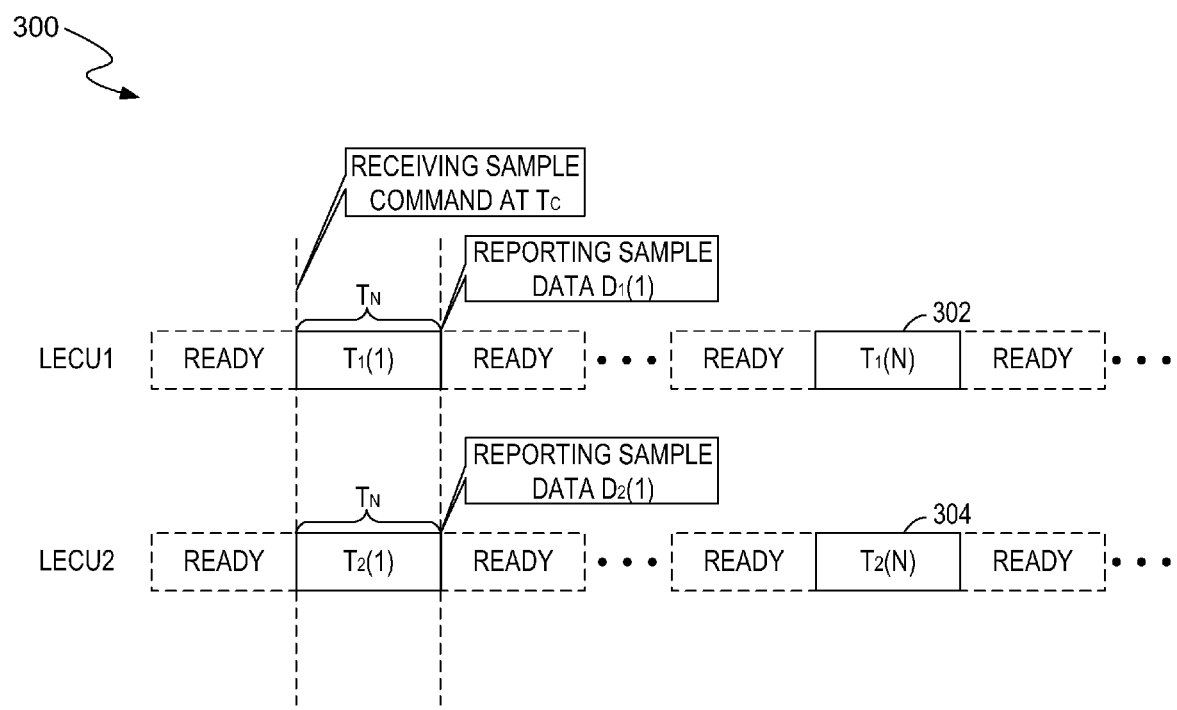
FIG. 3 illustrates a synchronous data sampling diagram for a battery management system, in accordance with one embodiment of the present invention.

FIG. 3 illustrates a synchronous data sampling diagram 300 for a battery management system, e.g., the battery management system 200A in FIG. 2A, in accordance with one embodiment of the present invention. FIG. 3 is described in combination with FIG. 2A.

In the example of FIG. 3, a data sampling diagram 302 for an LECU1 and a data sampling diagram 304 for an LECU2 are shown. The LECU1 and the LECU2 can be any two LECUs in the battery management system 200A. After the battery management system 200 starts up, the LECU1 and the LECU2 are ready to sample status information for the corresponding battery cells but wait for a sample command broadcast from the central ECU 214 during a ready period. When the LECU1 and the LECU2 receive the sample command from the central ECU 214 at time $T_C$, the LECU1 and the LECU2 can start a sample period $T_1(1)$ and a sample period $T_2(1)$ respectively and synchronously.

The LECU1 and the LECU2 can sample status information for the corresponding battery cells during the same sample period $T_N$. At the end of the sample period, the LECU1 and the LECU2 can report the sample data $D_1(1)$ and the sample data $D_2(1)$ to the central ECU 214 via the communication and control bus 212. Then the LECU1 and the LECU2 return to the ready state and wait for another sample command to be broadcast from the central ECU 214.

Figure 4:
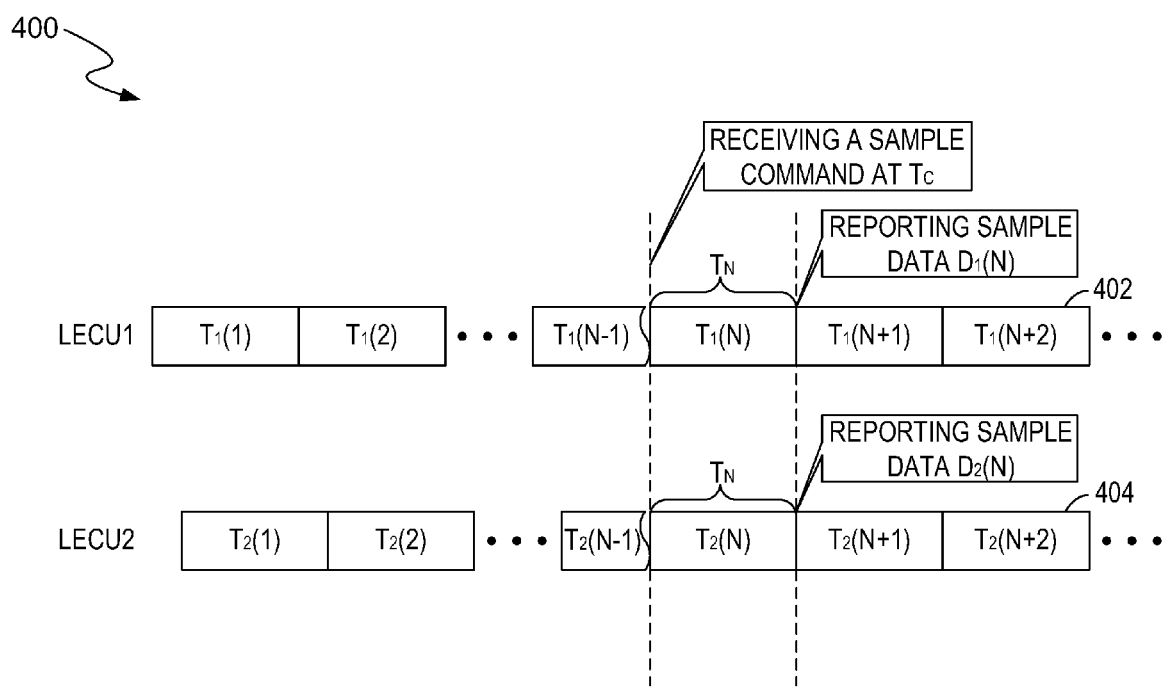
FIG. 4 illustrates a synchronous data sampling diagram for a battery management system, in accordance with one embodiment of the present invention.

FIG. 4 illustrates a synchronous data sampling diagram 400 for a battery management system, e.g., the battery management system 200A in FIG. 2A, in accordance with one embodiment of the present invention. FIG. 4 is described in combination with FIG. 2A. In the example of FIG. 4, a data sampling diagram 402 for an LECU1 and a data sampling diagram 404 for an LECU2 are shown. The LECU1 and the LECU2 can be any two LECUs in the battery management system 200A.

Compared to the embodiment of FIG. 3, the LECU1 and the LECU2 can start to sample the status information for the corresponding battery cells during continuous sample periods controlled by local clocks of the LECU1 and the LECU2, respectively, after the battery management system 200A starts up. When the two LECUs receive a sample command from the central ECU 214 at time $T_C$, the LECU1 and the LECU2 can synchronize their sample periods with each other. In one embodiment, the LECU1 and the LECU2 can stop their current sample periods $T_1(n-1)$ and $T_2(n-1)$, and start a new sample period $T_1(n)$ and a new sample period $T_2(n)$ synchronously.

The LECU1 and the LECU2 can sample the status information for the corresponding battery cells during the same sample period $T_N$. At the end of the sample period, the LECU1 and the LECU2 can report the sample data $D_1(N)$ and the sample data $D_2(N)$ to the central ECU 214 via the communication and control bus 212. Then the LECU1 and the LECU2 can continue to sample the status information for the corresponding battery cells during the sample periods contiguous with the preceding period, e.g., the LECU1 and the LECU2 can sample the status information for the corresponding battery cells during the sample periods $T_{1(2)}(n+1)$, $T_{1(2)}(n+2)$, ... contiguous with the preceding period $T_{1(2)}(n)$ and controlled by the corresponding local clocks.

In FIG. 3, the LECUs 2081-208N keep ready after the battery management system 200A starts to work and sample the status information for the battery cells after receiving the sample command. As such, if the central ECU 214 broadcasts a sample command to the LECUs 2081-208N, the LECUs 2081-208N can start to sample the status information for the battery cells in response to the sample command relatively quickly. In FIG. 4, the LECUs 2081-208N can sample the status information for the battery cells periodically after the battery management system 200A starts to work even if the LECUs 2081-208N do not receive the sample command. As such, if the central ECU 214 intends to get status information for one or more of the battery cells 2101-210N from the corresponding subset(s) of the LECUs 2081-208N, but does not necessarily need information that is sampled synchronously, the central ECU 214 can get the status information sampled during the latest sample period from the corresponding subset(s) of the LECUs 2081-208N directly without broadcasting a sample command.

Figure 5:
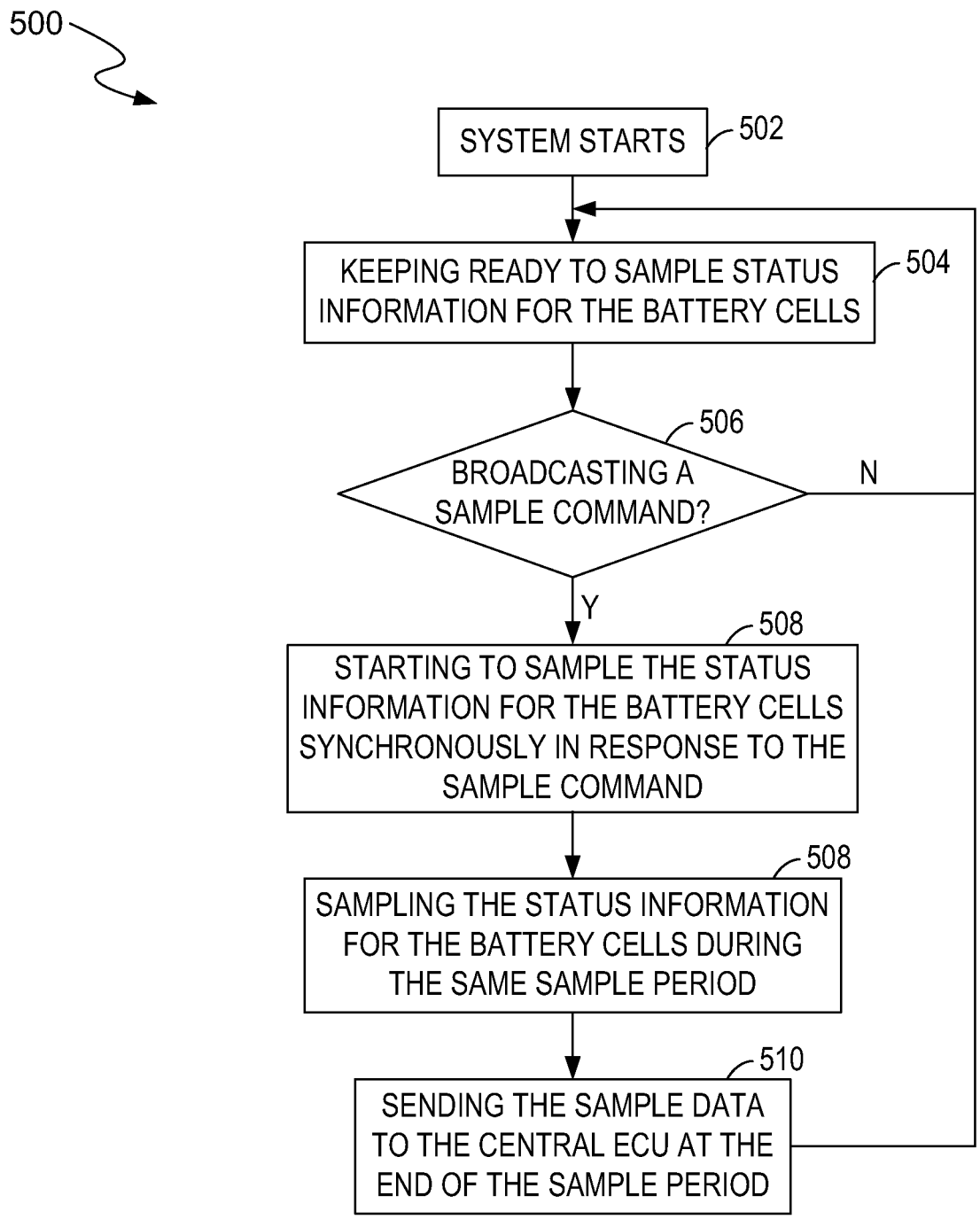
FIG. 5 illustrates a flowchart of operations performed by a battery management system, in accordance with one embodiment of the present invention.

FIG. 5 illustrates a flowchart 500 of operations performed by a battery management system, e.g. the battery management system 200A in FIG. 2A, in accordance with one embodiment of the present invention. FIG. 5 is described in combination with FIG. 2A.

In block 502, the battery management system 200A starts to operate. In block 504, the LECUs 2081-201N can keep ready to sample status information for the battery cells 2101-210N and wait for a sample command broadcast from the central ECU 214. In block 506, if the central ECU 214 broadcasts a sample command to the LECUs 2081-208N via the communication and control bus 212 synchronously, the LECUs 2081-208N can start to sample status information for the battery cells 2101-210N in response to the sample command in block 508. In block 506, if the central ECU 214 does not broadcast the sample command, the flowchart 500 will return to block 504.

In block 510, the LECUs 2081-208N can sample status information for the battery cells 2101-210N during the same sample period (a sample period that begins at the same time).

In block 512, the LECUs 2081-208N can send the sample data to the central ECU 214 via the communication and control bus 212 at the end of the sample period. Subsequently, the flowchart 500 will return to block 504. As such, the LECUs 2081-208N can keep ready to sample the status information for the battery cells 2101-210N and wait for another sample command broadcast from the central ECU 214.

Figure 6:
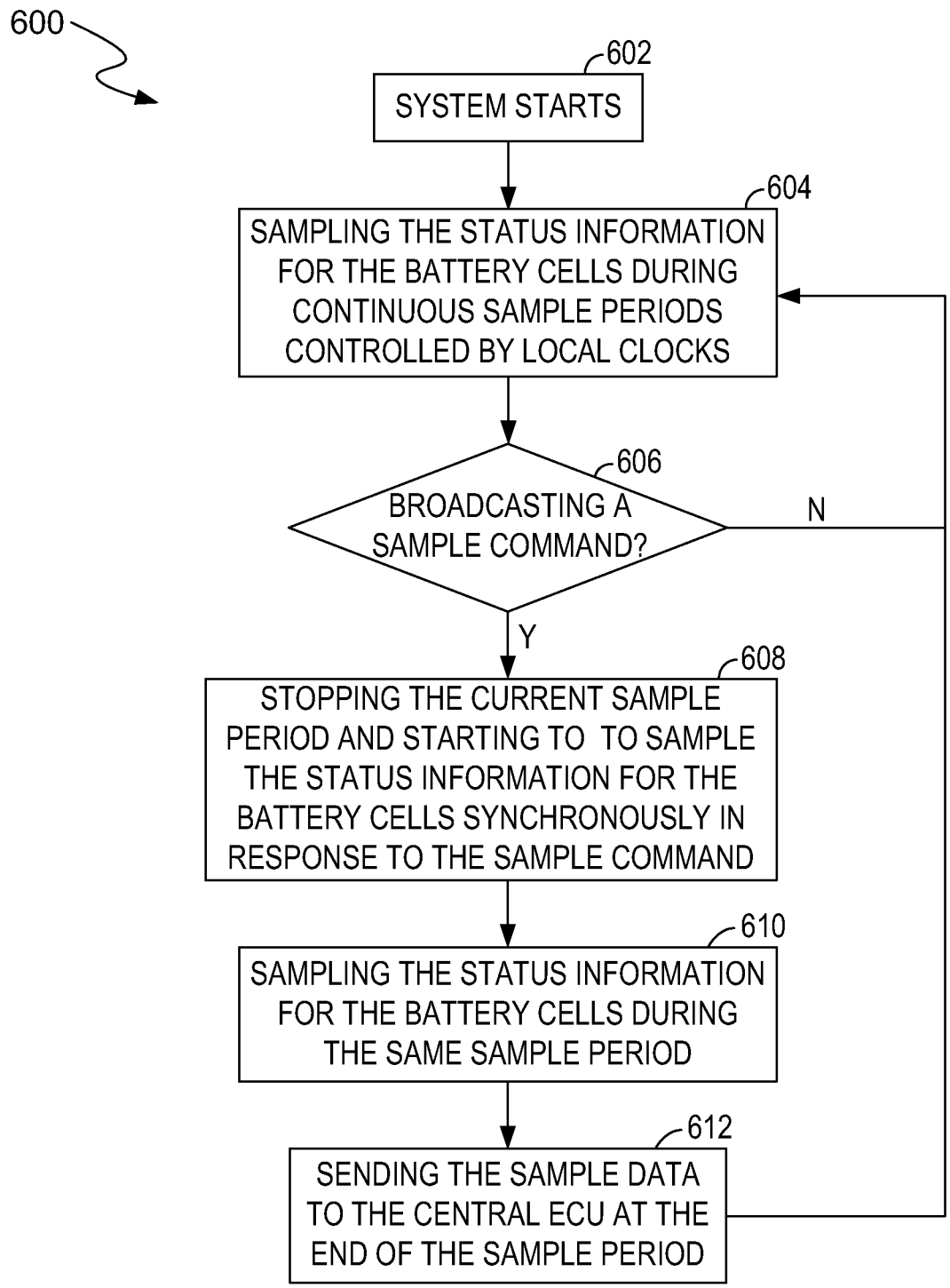
FIG. 6 illustrates a flowchart of operations performed by a battery management system, in accordance with one embodiment of the present invention.

FIG. 6 illustrates a flowchart 600 of operations performed by a battery management system, e.g. the battery management system 200A in FIG. 2A, in accordance with one embodiment of the present invention. FIG. 6 is described in combination with FIG. 2A.

In block 602, the battery management system 200 starts to operate. In block 604, the LECUs 2081-208N can sample the status information for the battery cells 2101-210N during continuous sample periods controlled by local clocks in the LECUs 2081-208N. In block 606, if the central ECU 214 broadcasts a sample command to the LECUs 2081-208N via the communication and control bus 212 synchronously, the LECUs 2081-208N can stop the current sample periods and start a new sample period in response to the sample command in block 608. In block 606, if the central ECU 214 does not broadcast the sample command, the flowchart 600 will return to block 604.

In block 610, the LECUs 2081-208N can sample the status information for the battery cells 2101-210N during the same sample period. In block 612, the LECUs 2081-208N can send the sample data to the central ECU 214 via the communication and control bus 212 at the end of the sample period. Subsequently, the flowchart 600 turns back to block 604. As such, the LECUs 2081-208N can continue to sample the status information for the battery cells 2101-210N during the sample periods contiguous with the preceding period and controlled by the corresponding local clocks.

Accordingly, embodiments in accordance with the present invention provide a battery management system with synchronized data sampling for a battery pack including multiple battery cells. The battery management system includes multiple local monitors, e.g., the LECU 2081-208N in FIG. 2A, to sample the status information for the corresponding battery cells, such as the battery cell voltages and/or the battery cell temperatures. The battery management system can also include a central controller, e.g., the central ECU 214 in FIG. 2A, and multiple upper controllers, e.g., the upper ECUs 2041-204M, to estimate the state of the battery pack/cells, such as the state of health and/or the state of charge.

When the central controller broadcasts a sample command to the local monitors synchronously, the local monitors can start to sample the status information for the corresponding battery cells during the same sample period. At the end of the sample period, the local monitors can send the sample data to the central controller. Advantageously, the status information for the battery cells can be sampled in the same environment (under the same conditions) even if the load current fluctuates frequently, such as electric vehicle/hybrid electric vehicle applications.

While the foregoing description and drawings represent embodiments of the present invention, it will be understood that various additions, modifications and substitutions can be made therein without departing from the spirit and scope of the principles of the present invention as defined in the accompanying claims. One skilled in the art will appreciate that the invention can be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A battery management system for energy efficient management of a rechargeable multi-cell battery pack, comprising:
   a plurality of local monitors coupled to a plurality of battery cells and operable for sampling status information for said battery cells;
   a plurality of upper controllers coupled to said local monitors and operable for estimating a state of at least one battery cell of said battery cells according to the status information for said at least one battery cell; and
   a central controller coupled to said upper controllers and operable for broadcasting a sample command to at least one upper controller of said upper controllers,
   wherein said at least one upper controller receives said sample command from said central controller and broadcasts said sample command to corresponding local monitors of said local monitors, and wherein said corresponding local monitors synchronously start a sample period for said sampling in response to said sample command, sample the status information for corresponding battery cells of said battery cells during said sample period, and synchronously stop said sample period.

2. The battery management system of claim 1, wherein said status information for said battery cells comprises information selected from the group consisting of: voltages of said battery cells, currents of said battery cells, and temperatures of said battery cells.

3. The battery management system of claim 1, further comprising a plurality of buses, each bus coupled between a corresponding upper controller and a group of local monitors, said bus operable for transferring said sample command from said corresponding upper controller to said croup of local monitors synchronously.

4. The battery management system of claim 3, wherein said corresponding local monitors send said status information for said corresponding battery cells to said central controller at the end of said sample period via said buses.

5. The battery management system of claim 1, wherein said corresponding local monitors send said status information for said corresponding battery cells to said central controller at the end of said sample period via said at least one upper controller.

6. The battery management system of claim 1, wherein said central controller estimates a state of said battery cells according to said status information for said battery cells.

7. The battery management system of claim 1, wherein said corresponding local monitors start to sample said status information for said corresponding battery cells during continuous sample periods controlled by local clocks when said battery management system starts to operate, and wherein said corresponding local monitors, in response to said sample command, synchronously stop current sample periods in said continuous sample periods and synchronously start a new sample period.

8. The battery management system of claim 1, wherein the number of said upper controllers is less than or equal to the number of said local monitors, and each upper controller is coupled to a predetermined number of local monitors in said local monitors.

9. A method for energy efficient managing of a plurality of battery cells of a rechargeable multi-cell battery pack, comprising:

broadcasting a sample command from a central controller to at least one upper controller of a plurality of upper controllers;

broadcasting said sample command from said at least one upper controller to corresponding local monitors in a plurality of local monitors;

synchronously starting a sample period, in said corresponding local monitors, in response to said sample command;

sampling status information for corresponding battery cells of said battery cells, using said corresponding local monitors, during said sample period;

synchronously stopping said sample period in said corresponding local monitors; and estimating a state of at least one battery cell of said corresponding battery cells according to the status information for said at least one battery cell.

10. The method of claim 9, further comprising:
transferring said sample command from an upper controller to a group of local monitors synchronously via a bus.

11. The method of claim 9, further comprising:
sending said status information for said corresponding battery cells to said central controller at the end of said sample period.

12. The method of claim 9, comprising:
starting to sample said status information for said corresponding battery cells during continuous sample periods controlled by local clocks in said corresponding local monitors when said battery management system starts to operate; and synchronously stopping current sample periods of said corresponding local monitors in said continuous sample periods and synchronously starting a new sample period for each of said corresponding local monitors, in response to said sample command.

13. The method of claim 9, wherein the number of said upper controllers is less than or equal to the number of said local monitors, and each upper controller is coupled to a predetermined number of local monitors in said local monitors.

14. A circuit for energy efficient monitoring of a plurality of battery cells of a rechargeable multi-cell battery pack, comprising:

a plurality of local monitors operable for sampling status information for said battery cells;

a plurality of upper controllers operable for receiving a sample command and estimating a state of at least one battery cell of said battery cells according to the status information for said at least one battery cell; and a plurality of buses coupled between said upper controllers and said local monitors and operable for transferring said sample command from at least one upper controller of said upper controllers to corresponding local monitors of said local monitors synchronously, wherein said corresponding local monitors synchronously start a sample period for said sampling in response to said sample command, sample the status information for corresponding battery cells of said battery cells during said sample period, and synchronously stop said sample period.

15. The circuit of claim 14, wherein said status information for said battery cells comprises information selected from the group consisting of: voltages of said battery cells, currents of said battery cells, and temperatures of said battery cells.

16. The circuit of claim 14, wherein said corresponding local monitors send said status information for said corresponding battery cells at the end of said sample period via at least one bus of said buses.

17. The circuit of claim 14, further comprising a central controller coupled to said upper controllers and operable for estimating a state of said battery cells according to said status information for said battery cells.

18. The circuit of claim 17, wherein said central controller broadcasts said sample command to said local monitors via said upper controllers synchronously.

19. The circuit of claim 14, wherein said corresponding local monitors start to sample said status information for said corresponding battery cells during continuous sample periods controlled by local clocks when said circuit starts to operate, and wherein said corresponding local monitors, in response to said sample command, synchronously stop current sample periods in said continuous sample periods and synchronously start a new sample period.

20. The circuit of claim 14, wherein the number of said upper controllers is less than or equal to the number of said local monitors, and each upper controller is coupled to a predetermined number of local monitors in said local monitors.

* * * * *